US009997625B2

(12) United States Patent
Furuhata

(10) Patent No.: US 9,997,625 B2
(45) Date of Patent: Jun. 12, 2018

(54) SEMICONDUCTOR DEVICE AND METHOD FOR MANUFACTURING THE SAME

(71) Applicant: SEIKO EPSON CORPORATION, Tokyo (JP)

(72) Inventor: Tomoyuki Furuhata, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days. days.

(21) Appl. No.: 14/817,664

(22) Filed: Aug. 4, 2015

(65) Prior Publication Data

US 2016/0064553 A1     Mar. 3, 2016

(30) Foreign Application Priority Data

Aug. 27, 2014  (JP) ................................. 2014-172196

(51) Int. Cl.
| | |
|---|---|
| *H01L 29/78* | (2006.01) |
| *H01L 29/66* | (2006.01) |
| *H01L 29/08* | (2006.01) |
| H01L 29/423 | (2006.01) |
| H01L 29/10 | (2006.01) |

(52) U.S. Cl.
CPC ...... *H01L 29/7816* (2013.01); *H01L 29/0878* (2013.01); *H01L 29/66681* (2013.01); *H01L 29/1083* (2013.01); *H01L 29/42368* (2013.01)

(58) Field of Classification Search
CPC ......... H01L 29/66613; H01L 29/66681; H01L 29/7816
See application file for complete search history.

(56) References Cited

U.S. PATENT DOCUMENTS

| | | | |
|---|---|---|---|
| 6,465,839 B2 | 10/2002 | Takahashi et al. | |
| 6,573,144 B2 | 6/2003 | Takahashi et al. | |
| 2002/0050619 A1* | 5/2002 | Kawaguchi | ........... H01L 27/088 257/368 |
| 2006/0157781 A1* | 7/2006 | Takimoto | ............ H01L 29/0873 257/335 |
| 2007/0090451 A1* | 4/2007 | Lee | ..................... H01L 29/0878 257/327 |
| 2013/0313639 A1* | 11/2013 | Shirai | ................. H01L 29/7816 257/335 |

FOREIGN PATENT DOCUMENTS

JP         2001-352070 A      12/2001

* cited by examiner

*Primary Examiner* — Jae Lee
(74) *Attorney, Agent, or Firm* — Oliff PLC

(57) ABSTRACT

A semiconductor device includes: a body region of a second conductivity type formed in a semiconductor layer of a first conductivity type in a semiconductor substrate; a gate electrode facing the body region via a gate insulating film; a source region of the first conductivity type formed in the body region, on a first side of the gate electrode; a drain region of the first conductivity type formed in the semiconductor substrate such that a field oxide film is disposed between the drain region and a second side of the gate electrode; and an impurity diffusion region of the first conductivity type having, at least in a partial region thereof between the drain region and the body region, an impurity concentration distribution in which a concentration of impurities becomes higher in accordance with a depth from a main face of the semiconductor substrate.

11 Claims, 9 Drawing Sheets

SEMICONDUCTOR DEVICE AND METHOD FOR MANUFACTURING THE SAME

CROSS REFERENCE

The entire disclose of Japanese Patent Application No. 2014-172196, filed Aug. 27, 2014, is expressly incorporated by reference herein.

BACKGROUND

1. Technical Field

The present invention relates to a semiconductor device including an LD (lateral double-diffused) MOS field effect transistor having an impurity diffusion region extending in a lateral direction of a semiconductor substrate, and a method for manufacturing the semiconductor device.

2. Related Art

In the process that manufactures an LDMOS field effect transistor in a related art, in order to form an N-well, impurities such as phosphorus ions are implanted to a surface of a semiconductor substrate, and are then diffused at a high temperature for a long time. Thus, the impurity concentration distribution in the N-well is in the form of a Gaussian distribution in the depth direction. That is to say, the concentration of impurities in a region below a gate oxide film is largest at a position adjacent to the gate oxide film, and becomes lower in accordance with the depth from the surface of the semiconductor substrate.

Accordingly, the specific resistance is smallest at the surface of the semiconductor substrate, and is large in the internal portion (bulk region) of the semiconductor substrate. Thus, when a bias voltage is applied to a drain region and a gate electrode using a source region as a reference, almost all the current flows along the surface of the semiconductor substrate. As a result, the electric field is concentrated near an end portion of the drain region.

In particular, when a high bias voltage is applied, the amount of current that flows near the end portion of the drain region increases, so that impact ionization occurs. Thus, holes and electrons are rapidly generated, and the on-state breakdown voltage is significantly lowered. Accordingly, SOA (safe operating area) characteristics and the hot carrier resistance of the LDMOS field effect transistor significantly deteriorate.

In the LDMOS field effect transistor in the related art, in order to improve the SOA characteristics, it is necessary to increase the length of a drift region where a current flows in the N-well, that is, the length of a field oxide film, resulting in an increase in the element size. Accordingly, it is difficult to improve the SOA characteristics and the hot carrier resistance, while maintaining the current characteristics and the breakdown voltage characteristics.

As a related technique, JP-A-2001-352070 (paragraphs 0028-0031, FIG. 1) describes a semiconductor device that is intended to improve the ESD (electrostatic discharge) surge resistance. This semiconductor device includes a substrate having a semiconductor layer of a first conductivity type, a base region of a second conductivity type formed in a surface portion of the semiconductor layer, a source region of the first conductivity type formed in a surface portion of the base region, a drain region of the first conductivity type spaced away from the base region, in the surface portion of the semiconductor layer, a gate insulating film formed on a channel region that is the base region positioned between the source region and the drain region, a gate electrode formed on the gate insulating film, a source electrode, and a drain electrode.

The surface portion of the semiconductor substrate is further provided with a region of the first conductivity type disposed between the drain region and the base region, wherein the region of the first conductivity type has a concentration that is higher than that of the semiconductor layer and that becomes higher toward the drain region. If the region of the first conductivity type is disposed in this manner, a current value when the LDMOS field effect transistor enters a negative resistance region can be increased, and the ESD surge resistance can be improved.

However, even in the case where a region of the first conductivity type having a concentration that becomes higher toward the drain region is provided, most current between the drain region and the source region flows along the surface of the semiconductor substrate. Thus, it is not possible to significantly improve the situation in which the electric field is concentrated near the end portion of the drain region.

SUMMARY

A first advantage of some aspects of the invention is to provide a semiconductor device including an LDMOS field effect transistor having improved SOA characteristics and improved hot carrier resistance, while maintaining the current characteristics and the breakdown voltage characteristics. A second advantage of some aspects of the invention is to provide, for example, a semiconductor device including an LDMOS field effect transistor having excellent breakdown voltage characteristics and excellent quality characteristics, without increasing the element size.

In order to solve the above-described problem, an aspect of the invention is directed to a semiconductor device, including: a field oxide film formed in a predetermined region on a main face of a semiconductor substrate; a body region of a second conductivity type formed in a semiconductor layer of a first conductivity type in the semiconductor substrate; a gate insulating film formed on part of the main face of the semiconductor substrate; a gate electrode formed on a surface of the gate insulating film and on a surface of the field oxide film, the gate electrode facing the body region via the gate insulating film; a source region of the first conductivity type formed in the body region, on a first side of the gate electrode; a drain region of the first conductivity type formed in the semiconductor substrate such that the field oxide film is disposed between the drain region and a second side of the gate electrode; and an impurity diffusion region of the first conductivity type having, at least in a partial region thereof between the drain region and the body region, an impurity concentration distribution in which a concentration of impurities becomes higher in accordance with a depth from the main face of the semiconductor substrate. In this application, the first conductivity type may be P-type and the second conductivity type may be N-type, or the first conductivity type may be N-type and the second conductivity type may be P-type.

Furthermore, another aspect of the invention is directed to a method for manufacturing a semiconductor device, including: (a) forming a field oxide film, in a predetermined region on a main face of a semiconductor substrate; (b) forming an impurity diffusion region of a first conductivity type having, at least in a partial region thereof, an impurity concentration distribution in which a concentration of impurities becomes higher in accordance with a depth from the main face of the semiconductor substrate, in a semiconductor layer of the first conductivity type in the semiconductor substrate; (c) forming a body region of a second conductivity type, in the semiconductor layer of the first conductivity type; (d) forming a gate insulating film, on the main face of the semiconductor substrate; (e) forming a gate electrode facing the body region via the gate insulating film, on a surface of the gate insulating film and on a surface of the field oxide film; and (f) forming a source region of the first conductivity type in the body region, on a first side of the gate electrode, and forming a drain region of the first conductivity type in the impurity diffusion region such that the field oxide film is disposed between the drain region and a second side of the gate electrode.

According to an aspect of the invention, an impurity diffusion region of the first conductivity type having, at least in its partial region between the drain region and the body region, an impurity concentration distribution in which the concentration of impurities becomes higher in accordance with the depth from the main face of the semiconductor substrate is provided. Thus, the current path concentrated on the surface of the semiconductor substrate is distributed. As a result, it is possible to suppress generation of holes and electrons due to impact ionization caused by concentration of the electric field near the end portion of the drain region, thereby making it possible to provide a semiconductor device including an LDMOS field effect transistor having improved SOA characteristics and improved hot carrier resistance, while maintaining the current characteristics and the breakdown voltage characteristics. Note that the above-described semiconductor layer includes wells.

It is desirable that the semiconductor substrate includes a base substrate, an intermediate layer of the first conductivity type formed in a surface portion of the base substrate, and the semiconductor layer of the first conductivity type formed on the intermediate layer, and the impurity diffusion region is in contact with the intermediate layer. Accordingly, the intermediate layer functions as part of the current path. Thus, the current path concentrated on the surface of the semiconductor substrate is distributed.

It is desirable that the impurity diffusion region is in contact with the drain region. Accordingly, the concentration of the electric field near the end portion of the drain region is significantly relaxed. In this case, it is desirable that, in at least part of the impurity diffusion region, a concentration of impurities of the first conductivity type becomes higher in accordance with a distance in a depth direction from the drain region. Accordingly, the current path concentrated on the surface of the semiconductor substrate is distributed in the region below the drain region.

The impurity diffusion region may be in contact with the field oxide film. Accordingly, the current path concentrated on the surface of the semiconductor substrate is distributed in a wide area. In this case, it is desirable that, in at least part of the impurity diffusion region, a concentration of impurities of the first conductivity type becomes higher in accordance with a distance in a depth direction from the field oxide film. Accordingly, the current path concentrated on the surface of the semiconductor substrate is distributed in the region below the field oxide film.

The impurity diffusion region may extend out below the body region. Accordingly, the concentration of currents on the surface of the semiconductor substrate is significantly relaxed. In this case, it is desirable that, in at least part of the impurity diffusion region, a concentration of impurities of the first conductivity type becomes higher in accordance with a distance in a depth direction from the body region.

Accordingly, the current path concentrated on the surface of the semiconductor substrate is distributed below the body region.

In the above-described configuration, the impurity diffusion region may not be in contact with the body region. Accordingly, the off-state breakdown voltage of the LDMOS field effect transistor is prevented from being lowered. Accordingly, it is possible to provide a semiconductor device including an LDMOS field effect transistor having excellent breakdown voltage characteristics and excellent quality characteristics, without increasing the element size.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
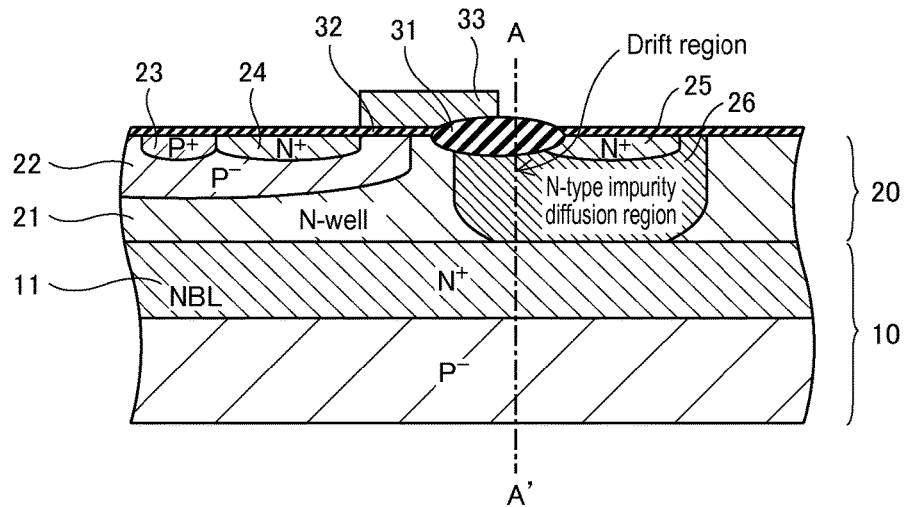
FIG. 1 is a cross-sectional view showing part of the structure of a semiconductor device according to the first embodiment of the invention.

The following describes embodiments of the invention in detail with reference to the drawings. Note that the same constituent elements are denoted by the same reference numerals, and a redundant description thereof has been omitted.

First Embodiment

FIG. 1 is a cross-sectional view schematically showing part of the structure of the semiconductor device according to the first embodiment of the invention. As shown in FIG. 1, this semiconductor device uses a semiconductor substrate including a P-type base substrate 10, an N-type buried diffused layer (NBL) 11 formed by implanting N-type impurities to a surface portion of the base substrate 10, and a P-type epitaxial layer 20 made of P-type semiconductor formed by epitaxial growth on the base substrate 10. The base substrate 10 and the epitaxial layer 20 are made of, for example, silicon (Si).

In the epitaxial layer 20, the semiconductor device further includes an N-well 21, a P-type body region 22 formed in the N-well 21, a P-type contact region 23 and an N-type source region 24 formed in the body region 22, an N-type drain region 25, and an N-type impurity diffusion region 26.

The semiconductor device further includes a field oxide film (also referred to as an "off-set insulating film") 31 formed in a predetermined region on a main face (upper face in FIG. 1) of the semiconductor substrate, a gate insulating film 32 formed on part of the main face of the semiconductor substrate, and a gate electrode 33 formed on part of surfaces of the gate insulating film 32 and the field oxide film 31, and facing the body region 22 via the gate insulating film 32.

A main portion of the N-channel LDMOS field effect transistor is configured by the constituent elements described above. The field oxide film 31 has a film thickness larger than that of the gate insulating film 32. On the surface of the field oxide film 31, a region near the drain region 25 is not provided with the gate electrode 33. Accordingly, the electric field intensity between the drain region 25 and the gate electrode 33 is relaxed, and, thus, the breakdown voltage of the transistor can be increased.

The epitaxial layer 20 is made of, for example, silicon (Si) containing boron (B) as P-type impurities. The epitaxial layer 20 has a specific resistance of preferably about 1 to 20 Ωcm, more preferably about 10 Ωcm. The epitaxial layer 20 has a film thickness of preferably about 3 to 10 μm, more preferably about 5 μm.

The source region 24 is formed in the body region 22, on one (left side in FIG. 1) of the sides of the gate electrode 33. The drain region 25 is formed in the epitaxial layer 20 such that the field oxide film 31 is held between the drain region 25 and the other side (right side in FIG. 1) of the gate electrode 33. Contact holes are formed through the gate insulating film 32 and interlayer insulating films (not shown), on the contact region 23, the source region 24, and the drain region 25, thereby allowing interconnects made of aluminum (Al) or the like or plugs made of tungsten (W) or the like to be connected to these regions.

In the thus configured LDMOS field effect transistor, when a bias voltage is applied to the drain region 25 and the gate electrode 33 using the source region 24 as a reference, a current flows between the drain region 25 and the source region 24. The region in which a current flows between the drain region 25 and the body region 22 is referred to as a drift region.

The impurity diffusion region 26 is formed in at least part of the region between the drain region 25 and the body region 22, that is, at least part of the drift region. The impurity diffusion region 26 has, at least in its partial region between the drain region 25 and the body region 22, an impurity concentration distribution in which the concentration of impurities becomes higher in accordance with the depth from the main face of the semiconductor substrate. Accordingly, the current path concentrated on the surface of the semiconductor substrate is distributed.

It is desirable that the impurity diffusion region 26 is in contact with the drain region 25. Accordingly, the concentration of the electric field near the end portion of the drain region 25 is significantly relaxed. Furthermore, it is desirable that the impurity diffusion region 26 is in contact with the buried diffused layer 11. Accordingly, the buried diffused layer 11, which is an intermediate layer, functions as part of the current path, and, thus, the effect of distributing the current path increases.

Meanwhile, it is desirable that the impurity diffusion region 26 is not in contact with the body region 22. Accordingly, the off-state breakdown voltage of the LDMOS field effect transistor is prevented from being lowered. Accordingly, it is possible to provide a semiconductor device including an LDMOS field effect transistor having excellent breakdown voltage characteristics and excellent quality characteristics, without increasing the element size.

In the first embodiment, the impurity diffusion region 26 is provided not only in the region below the drain region 25 but also in the region below at least part of the field oxide film 31. Accordingly, the impurity diffusion region 26 is in contact with the drain region 25 and the field oxide film 31. Accordingly, the current path concentrated on the surface of the semiconductor substrate is distributed in a wide area.

Figure 2:
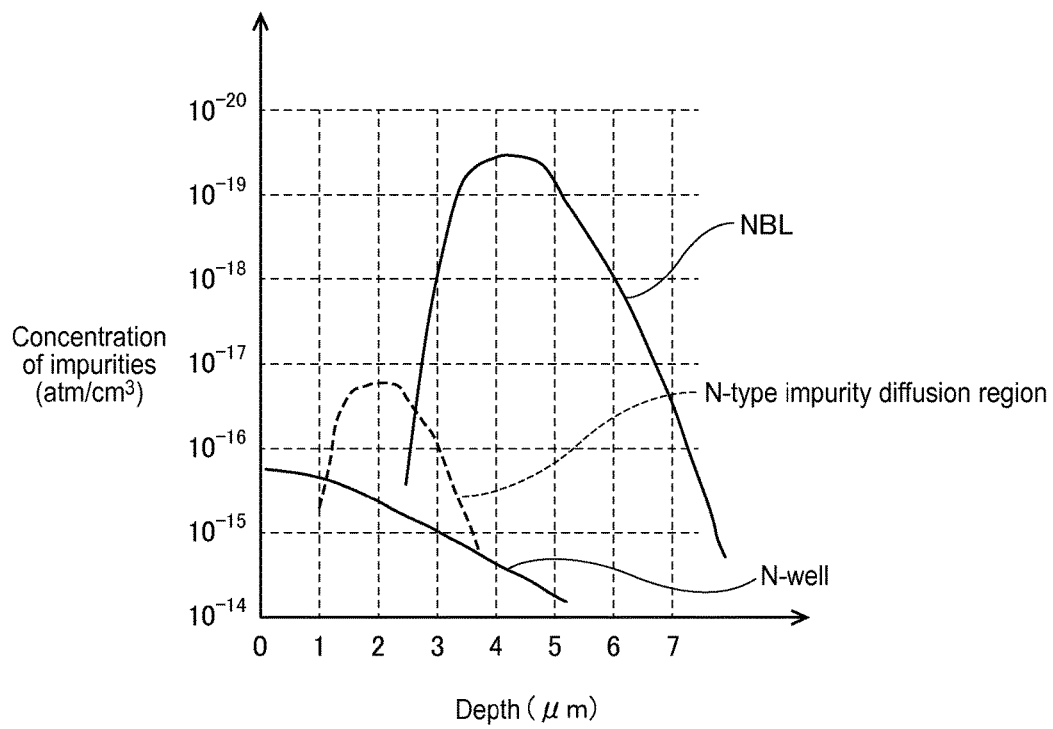
FIG. 2 is a graph showing a first example of the impurity concentration distribution in the semiconductor device shown in FIG. 1.

FIG. 2 is a graph showing a first example of the impurity concentration distribution taken along the line A-A' in the semiconductor device shown in FIG. 1. In FIG. 2, the horizontal axis indicates the depth (μm) from the lower face of the field oxide film 31, and the vertical axis indicates the concentration (atm/cm$^3$) of impurities.

If the impurity diffusion region 26 is not provided, the concentration of impurities in the N-well 21 is highest at a position adjacent to the field oxide film 31, and becomes lower in accordance with the depth from the lower face of the field oxide film 31. Furthermore, the concentration of impurities in the buried diffused layer (NBL) 11 has a peak at a predetermined depth, and rapidly becomes lower toward the lower face of the field oxide film 31.

Accordingly, without the impurity diffusion region 26, a valley in the concentration of impurities is generated, and almost all the current flows along the main face of the semiconductor substrate. Thus, the electric field is concentrated near the end portion of the drain region 25. If the amount of current that flows near the end portion of the drain region 25 increases to cause impact ionization, holes and electrons are rapidly generated, and the on-state breakdown voltage is significantly lowered. Accordingly, the SOA characteristics and the hot carrier resistance significantly deteriorate.

On the other hand, the case in which the impurity diffusion region 26 is provided is as follows. The impurity diffusion region 26 has, in its region with a depth from the lower face of the field oxide film 31 of about 1.0 to 2.5 μm, an impurity concentration distribution in which the concentration of N-type impurities becomes higher in accordance with the distance in the depth direction from the field oxide film 31 as indicated by the broken line. Accordingly, the valley in the concentration of N-type impurities indicated by the solid lines in FIG. 2 can be compensated for. Thus, the current path concentrated on the surface of the semiconductor substrate is distributed in the region below the field oxide film 31.

As a result, it is possible to suppress generation of holes and electrons due to impact ionization caused by concentration of the electric field near the end portion of the drain region 25, thereby making it possible to provide a semiconductor device including an LDMOS field effect transistor having improved SOA characteristics and improved hot carrier resistance, while maintaining the current characteristics and the breakdown voltage characteristics.

Figure 3:
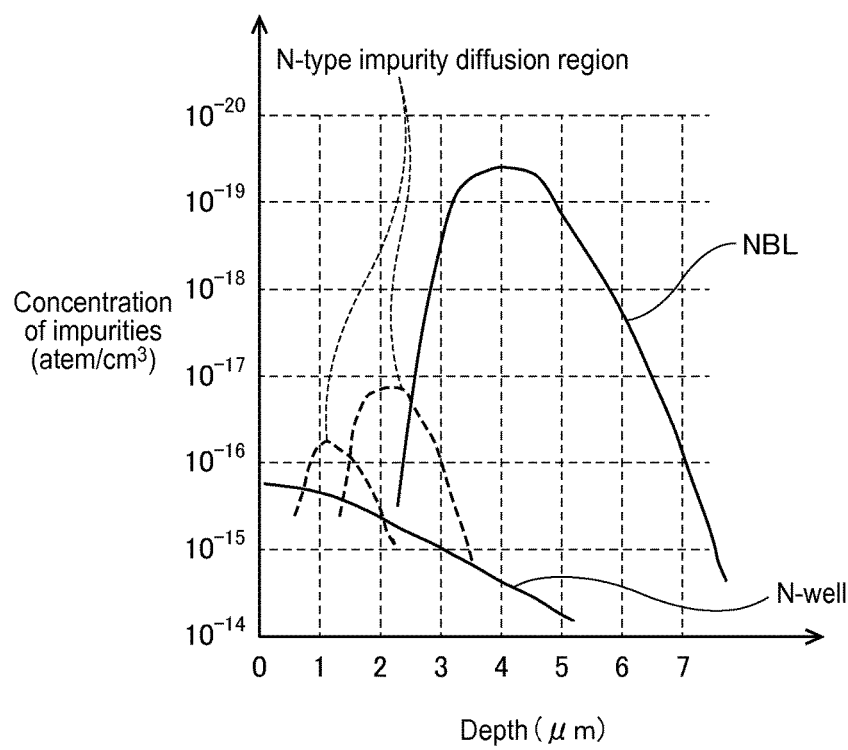
FIG. 3 is a graph showing a second example of the impurity concentration distribution in the semiconductor device shown in FIG. 1.

FIG. 3 is a graph showing a second example of the impurity concentration distribution taken along the line A-A' in the semiconductor device shown in FIG. 1. In FIG. 3, the horizontal axis indicates the depth (μm) from the lower face of the field oxide film 31, and the vertical axis indicates the concentration (atm/cm$^3$) of impurities. In the second example, N-type impurities are implanted a plurality of times in order to form the impurity diffusion region 26.

For example, if N-type impurities are implanted twice, the concentration of impurities in the surface region of the epitaxial layer 20 can be set in a first impurity implantation, and the concentration of impurities in the internal region of the epitaxial layer 20 can be set in a second impurity implantation. In this manner, if the impurity implantation is performed a plurality of times, the impurity concentration distribution in the impurity diffusion region 26 can be finely controlled. Note that the first impurity implantation and the second impurity implantation may be performed in the opposite order.

The two broken lines in FIG. 3 indicate concentrations of N-type impurities realized by impurity implantation performed twice in order to form the impurity diffusion region 26. As shown in FIG. 3, the impurity diffusion region 26 has, at least in its partial region, an impurity concentration distribution in which the concentration of N-type impurities becomes higher in accordance with the distance in the depth direction from the field oxide film 31. Accordingly, the valley in the concentration of N-type impurities indicated by the solid lines in FIG. 3 can be compensated for. Thus, the current path concentrated on the surface of the semiconductor substrate is distributed in the region below the field oxide film 31.

The impurity concentration distribution (impurity concentration profile) in the impurity diffusion region 26 can be set according to the design breakdown voltage of the LDMOS field effect transistor. Furthermore, it is possible to optimize the characteristics of the LDMOS field effect transistor, by additionally performing ion implantation to the surface of the semiconductor substrate as needed.

Figure 4:
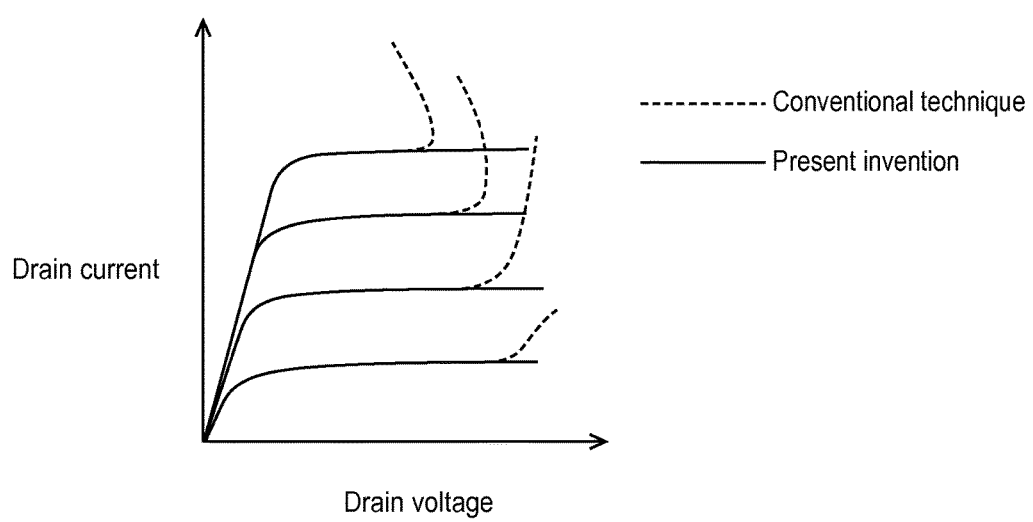
FIG. 4 is a graph illustrating current-voltage characteristics of an LDMOS field effect transistor.

FIG. 4 is a graph illustrating the current-voltage characteristics of the LDMOS field effect transistor in the first embodiment of the invention, in comparison with a conventional technique. In FIG. 4, the horizontal axis indicates the drain voltage, and the vertical axis indicates the drain current. The broken lines indicate current-voltage characteristics of the LDMOS field effect transistor in the conventional technique, and the solid lines indicate the current-voltage characteristics of the LDMOS field effect transistor in the first embodiment of the invention.

In the LDMOS field effect transistor, if the drain voltage is increased while keeping the gate voltage constant, the drain current increases to reach a certain value. However, if the drain voltage is further increased, the LDMOS field effect transistor in the conventional technique causes impact ionization to have negative resistance characteristics, and the drain current rapidly increases. On the other hand, the LDMOS field effect transistor according to the first embodiment of the invention hardly causes impact ionization, even when the drain voltage is increased, and, thus, a rapid increase in the drain current can be suppressed.

Next, a method for manufacturing the semiconductor device according to the first embodiment of the invention will be described.

FIGS. 5A to 5I are cross-sectional views in a manufacturing process of the semiconductor device according to the first embodiment of the invention. First, for example, a silicon (Si) substrate containing boron (B) as P-type impurities is prepared as the P-type base substrate 10.

Figure 5A:
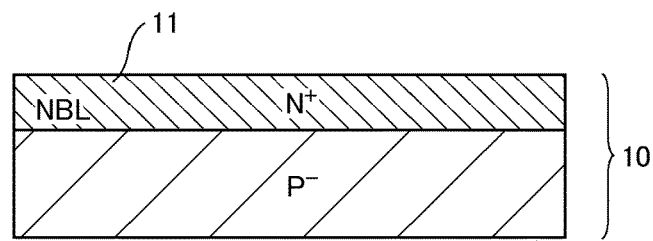
FIG. 5A is a cross-sectional view in a manufacturing process of the semiconductor device according to the first embodiment of the invention.
Figure 5B:
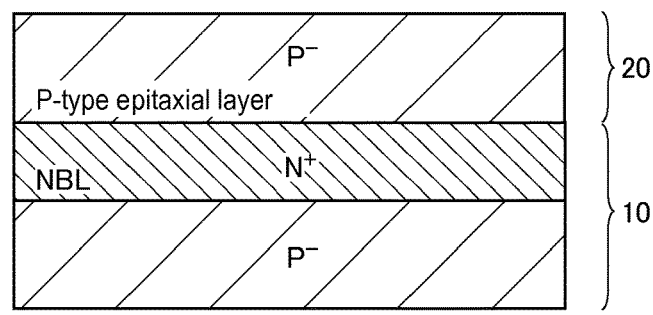
FIG. 5B is a cross-sectional view in a manufacturing process of the semiconductor device according to the first embodiment of the invention.

As shown in FIG. 5A, N-type impurities such as antimony (Sb) or phosphorus (P) ions are implanted to the surface portion of the P-type base substrate 10. Subsequently, the N-type impurities are diffused by heat, so that the N-type buried diffused layer (NBL) 11 is formed. Then, as shown in FIG. 5B, the P-type epitaxial layer 20 is formed by causing epitaxial growth of P-type semiconductor atoms on the base substrate 10.

It is possible to form a P-type epitaxial layer 20 having a desired conductivity (specific resistance), for example, by mixing gas of P-type impurities such as boron (B) during the epitaxial growth of silicon atoms on the silicon substrate. The semiconductor substrate is configured by the base substrate 10 and the epitaxial layer 20.

Figure 5C:
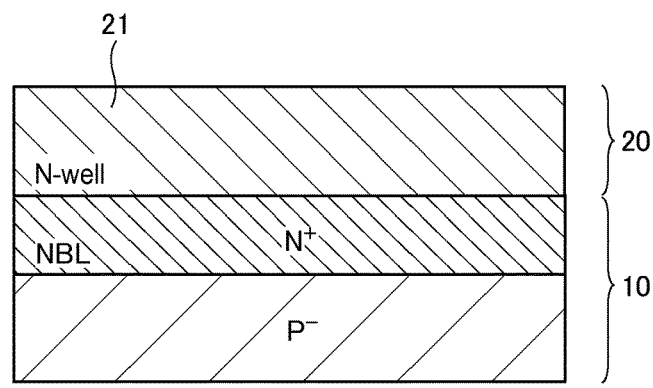
FIG. 5C is a cross-sectional view in a manufacturing process of the semiconductor device according to the first embodiment of the invention.

Next, as shown in FIG. 5C, the N-well 21 is formed by implanting N-type impurities such as phosphorus (P) ions to part of the epitaxial layer 20. For example, in the case of implanting the phosphorus ions to the silicon epitaxial layer according to the high-energy ion implantation method, the accelerating voltage is preferably about 1 to 5 MeV, more preferably about 2.6 MeV. Furthermore, the dose amount is preferably about $5\times10^{11}$ to $5\times10^{12}$/cm$^2$, more preferably about $1.8\times10^{12}$/cm$^2$.

The N-type impurities implanted to the epitaxial layer 20 are diffused by heat. For example, in the case of diffusing phosphorus implanted to the silicon epitaxial layer, the heating temperature is preferably about 1100 to 1200° C., more preferably about 1150° C. Furthermore, the heating time is preferably about 7 to 10 hours, more preferably about 9 hours.

Figure 5D:
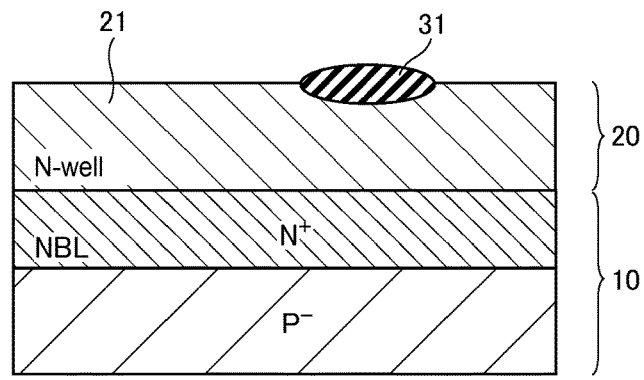
FIG. 5D is a cross-sectional view in a manufacturing process of the semiconductor device according to the first embodiment of the invention.

Next, as shown in FIG. 5D, the field oxide film 31 is formed in a predetermined region on the main face of the semiconductor substrate (the surface of the N-well 21), for example, using the LOCOS (local oxidation of silicon)

method. Note that the formation of the field oxide film 31 may be performed after forming the impurity diffusion region 26. Furthermore, element isolation regions may be formed using STI (shallow trench isolation), instead of LOCOS.

Figure 5E:
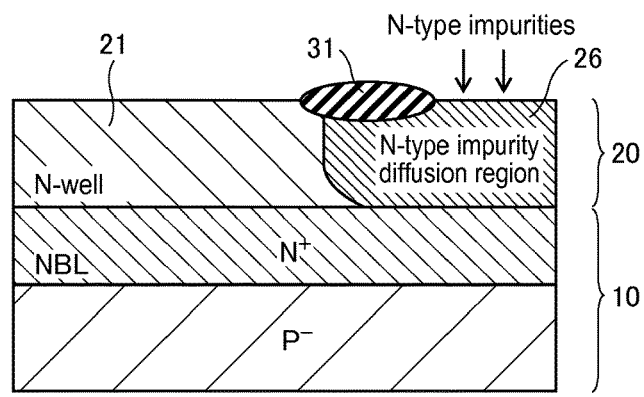
FIG. 5E is a cross-sectional view in a manufacturing process of the semiconductor device according to the first embodiment of the invention.

Next, as shown in FIG. 5E, N-type impurities such as phosphorus (P) ions are implanted to part of the N-well 21 (part of the drift region), using a mask formed by the photolithography method. Accordingly, the N-type impurity diffusion region 26 having, at least in its partial region, an impurity concentration distribution in which the concentration of impurities becomes higher in accordance with the depth from the main face of the semiconductor substrate is formed. For example, in the case of implanting the phosphorus ions to the silicon epitaxial layer according to the high-energy ion implantation method, the accelerating voltage is preferably about 250 keV, and the dose amount is preferably about $8 \times 10^{12}/cm^2$.

Alternatively, the N-type impurities may be implanted a plurality of times. For example, in the case of implanting the phosphorus ions to the silicon epitaxial layer twice according to the high-energy ion implantation method, in a first implantation, the accelerating voltage is preferably about 200 keV to 3 MeV, and the dose amount is preferably about $5 \times 10^{11}$ to $1 \times 10^{13}/cm^2$. In a second implantation, the accelerating voltage is preferably about 1 to 5 MeV, and the dose amount is preferably about $5 \times 10^{11}$ to $1 \times 10^{13}/cm^2$.

Figure 5F:
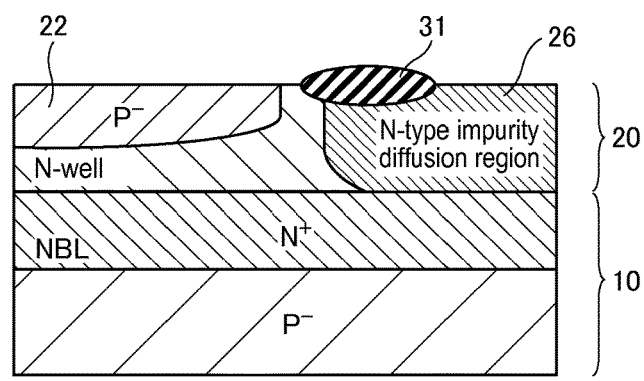
FIG. 5F is a cross-sectional view in a manufacturing process of the semiconductor device according to the first embodiment of the invention.
Figure 5G:
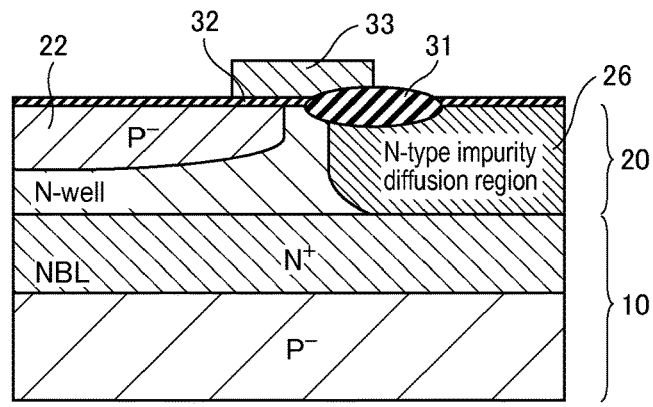
FIG. 5G is a cross-sectional view in a manufacturing process of the semiconductor device according to the first embodiment of the invention.

Next, as shown in FIG. 5F, the P-type body region 22 is formed by implanting P-type impurities such as boron (B) ions to part of the N-well 21. Then, as shown in FIG. 5G, the gate insulating film 32 is formed on the main face of the semiconductor substrate, for example, by thermally oxidizing the main face of the semiconductor substrate. Furthermore, the gate electrode 33 facing the body region 22 via the gate insulating film 32 is formed using poly silicon or the like made conductive by doping with impurities, on part of the surfaces of the gate insulating film 32 and the field oxide film 31.

Figure 5H:
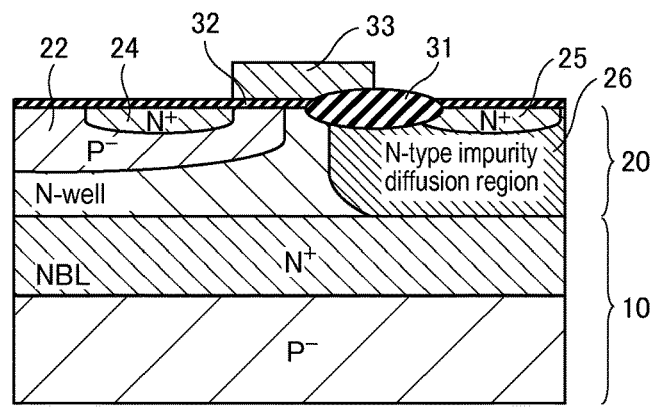
FIG. 5H is a cross-sectional view in a manufacturing process of the semiconductor device according to the first embodiment of the invention.

Next, as shown in FIG. 5H, N-type impurities such as phosphorus (P) ions or arsenic (As) ions are implanted to part of the body region 22 and part of the impurity diffusion region 26. Accordingly, the N-type source region 24 is formed in the body region 22, on one of the sides of the gate electrode 33, and the N-type drain region 25 is formed in the impurity diffusion region 26 such that the field oxide film 31 is held between the drain region 25 and the other side of the gate electrode 33.

Figure 5I:
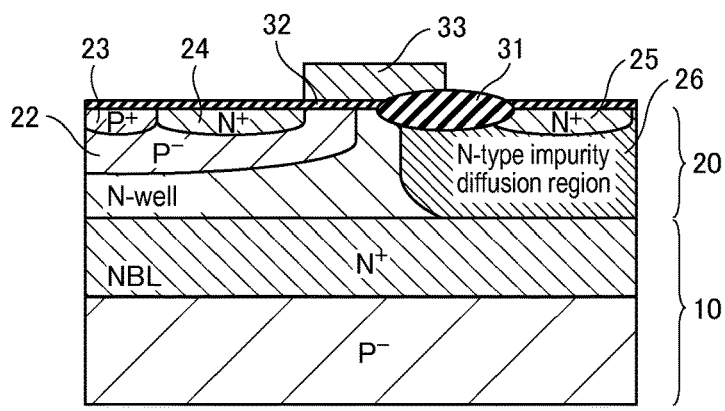
FIG. 5I is a cross-sectional view in a manufacturing process of the semiconductor device according to the first embodiment of the invention.

Next, as shown in FIG. 5I, the P-type contact region 23 is formed by implanting P-type impurities such as boron (B) ions to part of the body region 22. The following process is similar to the process for manufacturing ordinary semiconductor devices. That is to say, a predetermined number of interlayer insulating films and wiring layers are formed. Contact holes are formed through the gate insulating film 32 and the interlayer insulating films, on the contact region 23, the source region 24, and the drain region 25, thereby allowing interconnects made of aluminum (Al) or the like or plugs made of tungsten (W) or the like to be connected to these regions.

According to the above-described manufacturing method, it is possible to set the impurity concentration distribution in the impurity diffusion region 26, without the influence of a long heating process for forming the N-well 21. Thus, it is possible to easily control the characteristics of the LDMOS field effect transistor.

Second Embodiment

Next, a second embodiment of the invention will be described.

Figure 6:
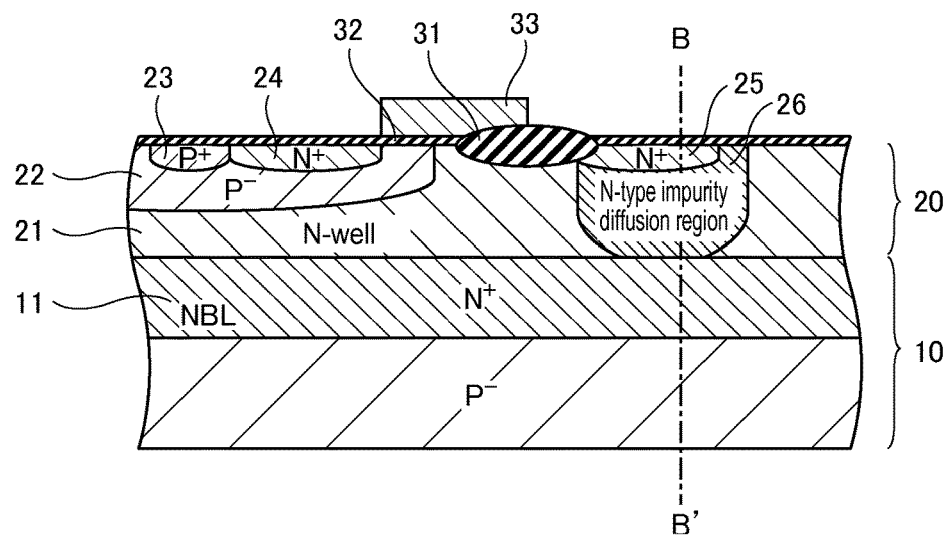
FIG. 6 is a cross-sectional view showing part of the structure of a semiconductor device according to a second embodiment of the invention.

FIG. 6 is a cross-sectional view schematically showing part of the structure of a semiconductor device according to the second embodiment of the invention. In the second embodiment, as shown in FIG. 6, the impurity diffusion region 26 is provided in the region below the drain region 25, but is not provided in the region below the field oxide film 31. Except for this aspect, the second embodiment is the same as the first embodiment.

Figure 7:
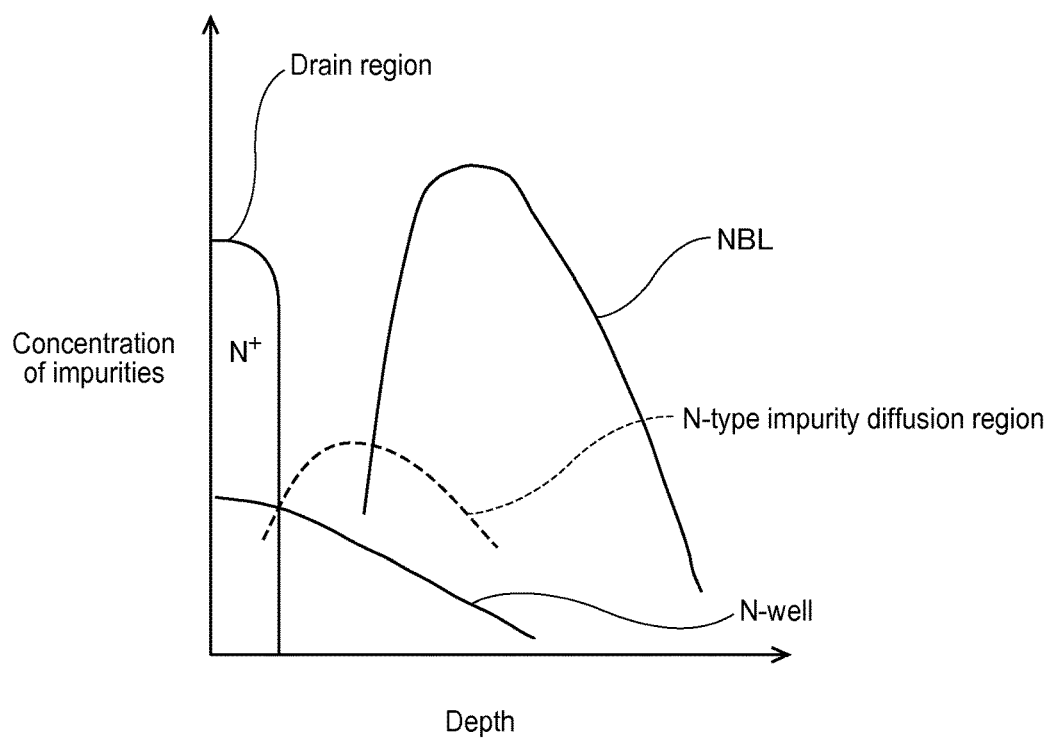
FIG. 7 is a graph showing an example of the impurity concentration distribution in the semiconductor device shown in FIG. 6.

FIG. 7 is a graph showing an example of the impurity concentration distribution taken along the line B-B' in the semiconductor device shown in FIG. 6. In FIG. 7, the horizontal axis indicates the depth from the main face of the semiconductor substrate, and the vertical axis indicates the concentration of impurities.

If the impurity diffusion region 26 is not provided, the concentration of impurities in the N-well 21 is highest at a position adjacent to the drain region 25, and becomes lower in accordance with the depth from the main face of the semiconductor substrate. Furthermore, the concentration of impurities in the buried diffused layer (NBL) 11 has a peak at a predetermined depth, and rapidly becomes lower toward the main face of the semiconductor substrate.

Accordingly, without the impurity diffusion region 26, a valley in the concentration of impurities is generated, and almost all the current flows along the main face of the semiconductor substrate. Thus, the electric field is concentrated near the end portion of the drain region 25. If the amount of current that flows near the end portion of the drain region 25 increases to cause impact ionization, holes and electrons are rapidly generated, and the on-state breakdown voltage is significantly lowered. Accordingly, the SOA characteristics and the hot carrier resistance significantly deteriorate.

On the other hand, the case in which the impurity diffusion region 26 is provided is as follows. The impurity diffusion region 26 has, at least in its partial region, an impurity concentration distribution in which the concentration of N-type impurities becomes higher in accordance with the distance in the depth direction from the drain region 25. Accordingly, the valley in the concentration of N-type impurities indicated by the solid lines in FIG. 7 can be compensated for. Thus, the current path concentrated on the surface of the semiconductor substrate is distributed in the region below the drain region 25. Furthermore, since the impurity diffusion region 26 is away from the body region 22, the off-state breakdown voltage of the LDMOS field effect transistor can be more reliably prevented from being lowered.

The semiconductor device according to the second embodiment can be manufactured using the method for manufacturing the semiconductor device according to the first embodiment, by changing the mask used for forming the impurity diffusion region 26.

Third Embodiment

Next, a third embodiment of the invention will be described.

Figure 8:
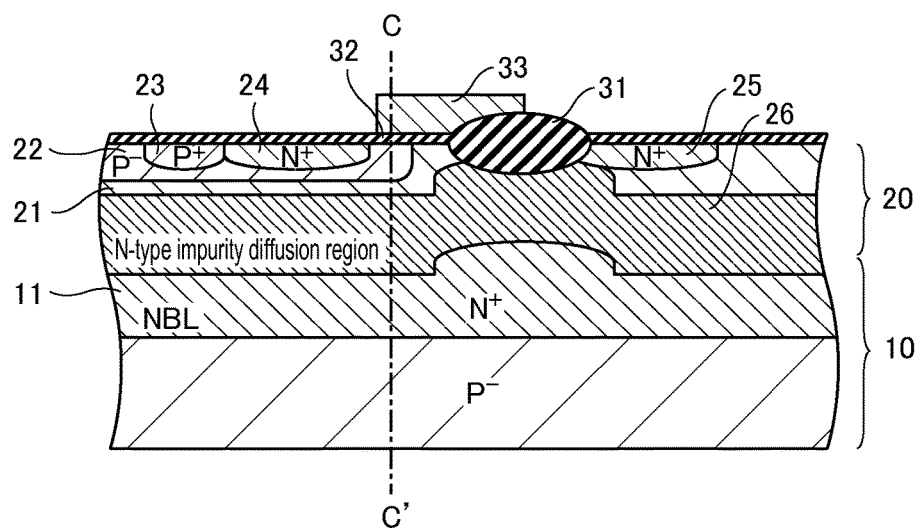
FIG. 8 is a cross-sectional view showing part of the structure of a semiconductor device according to a third embodiment of the invention.

FIG. 8 is a cross-sectional view schematically showing part of the structure of a semiconductor device according to the third embodiment of the invention. In the third embodiment, as shown in FIG. 8, the impurity diffusion region 26 is provided in the region below the drain region 25 and in the region below the field oxide film 31, and further extends out below the body region 22. Except for this aspect, the third embodiment is the same as the first embodiment.

Figure 9:
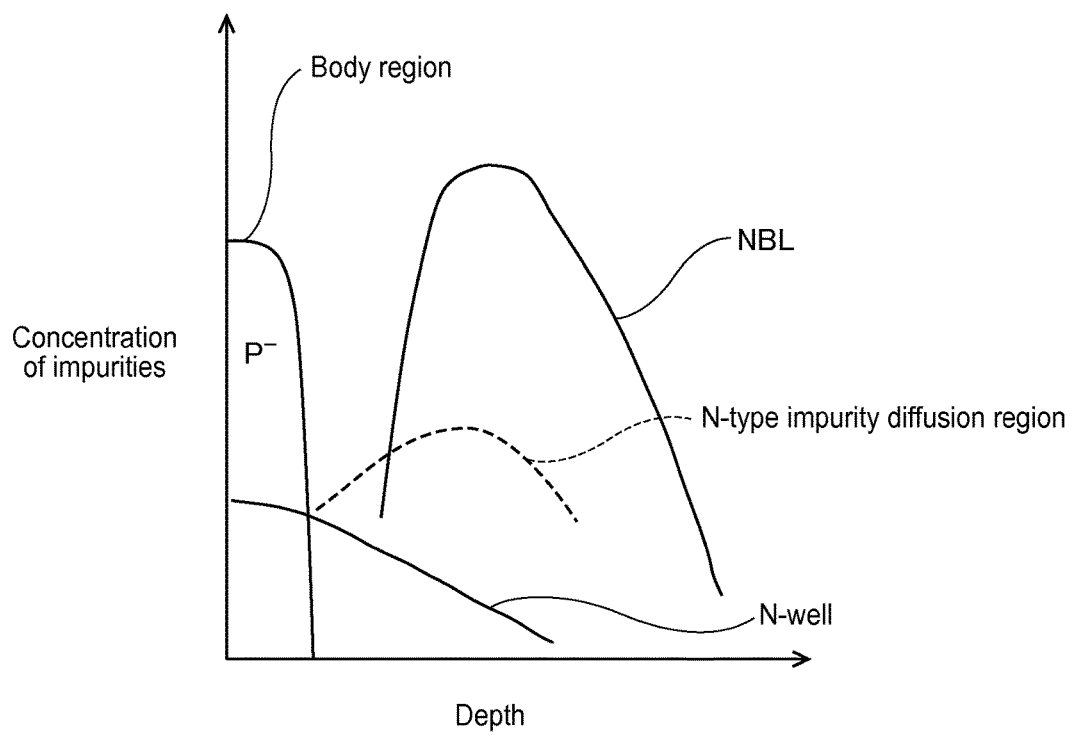
FIG. 9 is a graph showing an example of the impurity concentration distribution in the semiconductor device shown in FIG. 8.

FIG. 9 is a graph showing an example of the impurity concentration distribution taken along the line C-C' in the semiconductor device shown in FIG. 8. In FIG. 9, the horizontal axis indicates the depth from the main face of the semiconductor substrate, and the vertical axis indicates the concentration of impurities.

If the impurity diffusion region 26 is not provided, the concentration of impurities in the N-well 21 is highest at a position adjacent to the body region 22, and becomes lower in accordance with the depth from the main face of the semiconductor substrate. Furthermore, the concentration of impurities in the buried diffused layer (NBL) 11 has a peak at a predetermined depth, and rapidly becomes lower toward the main face of the semiconductor substrate.

Accordingly, without the impurity diffusion region 26, a valley in the concentration of impurities is generated, and almost all the current flows along the main face of the semiconductor substrate. Thus, the electric field is concentrated near the end portion of the drain region 25. If the amount of current that flows near the end portion of the drain region 25 increases to cause impact ionization, holes and electrons are rapidly generated, and the on-state breakdown voltage is significantly lowered. Accordingly, the SOA characteristics and the hot carrier resistance significantly deteriorate.

On the other hand, the case in which the impurity diffusion region 26 is provided is as follows. The impurity diffusion region 26 has, at least in its partial region, an impurity concentration distribution in which the concentration of N-type impurities becomes higher in accordance with the distance in the depth direction from the body region 22. Accordingly, the valley in the concentration of N-type impurities indicated by the solid lines in FIG. 9 can be compensated for. Thus, the current path concentrated on the surface of the semiconductor substrate is distributed below the body region 22. Furthermore, since the impurity diffusion region 26 extends out below the body region 22, the concentration of currents on the surface of the semiconductor substrate is significantly relaxed.

Next, a method for manufacturing the semiconductor device according to the third embodiment of the invention will be described.

FIGS. 10A to 10E are cross-sectional views in a manufacturing process of the semiconductor device according to the third embodiment of the invention. The first half of the manufacturing process is the same as that shown in FIGS. 5A to 5C, and, thus, a description thereof has been omitted.

Figure 10A:
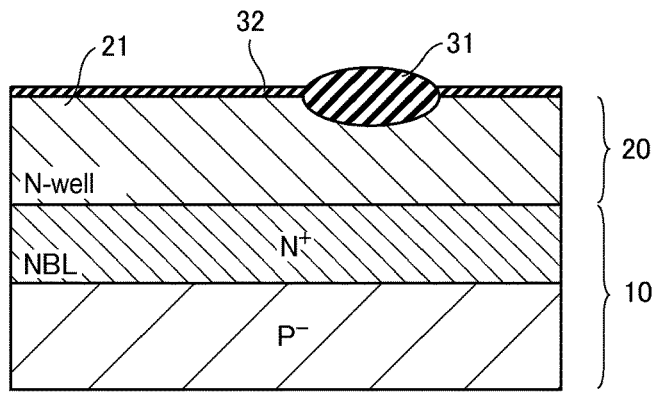
FIG. 10A is a cross-sectional view in a manufacturing process of the semiconductor device according to the third embodiment of the invention.

As shown in FIG. 10A, the field oxide film 31 is formed in a predetermined region on the main face of the semiconductor substrate (the surface of the N-well 21), for example, using the LOCOS method. Furthermore, the gate insulating film 32 is formed on the main face of the semiconductor substrate, for example, by thermally oxidizing the main face of the semiconductor substrate. Note that the formation of the field oxide film 31 or the gate insulating film 32 may be performed after forming the impurity diffusion region 26.

Figure 10B:
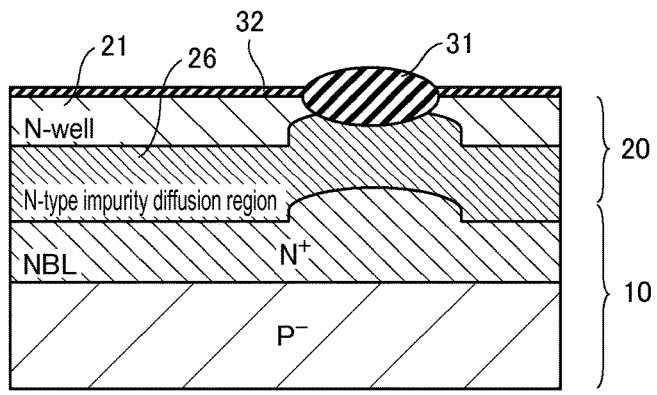
FIG. 10B is a cross-sectional view in a manufacturing process of the semiconductor device according to the third embodiment of the invention.

Next, as shown in FIG. 10B, the N-type impurity diffusion region 26 is formed by implanting N-type impurities such as phosphorus (P) ions to at least part of the N-well 21 (the entire drift region). The formed N-type impurity diffusion region 26 has, at least in its partial region, an impurity concentration distribution in which the concentration of impurities becomes higher in accordance with the depth from the main face of the semiconductor substrate. Note that the N-type impurities may be implanted a plurality of times.

Figure 10C:
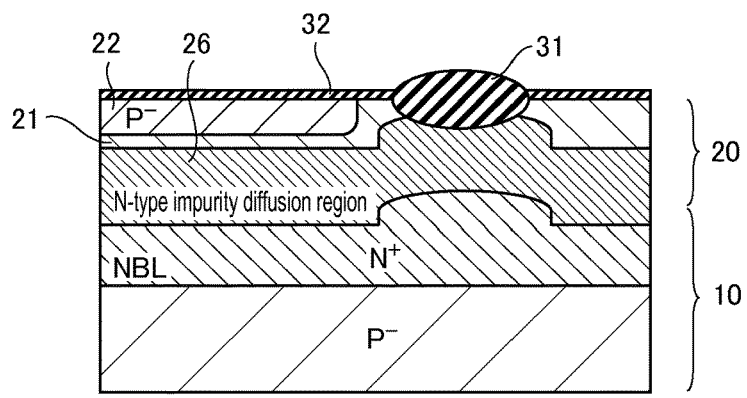
FIG. 10C is a cross-sectional view in a manufacturing process of the semiconductor device according to the third embodiment of the invention.
Figure 10D:
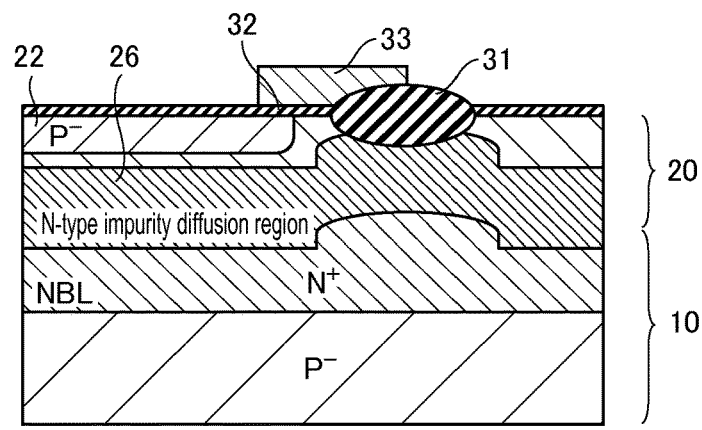
FIG. 10D is a cross-sectional view in a manufacturing process of the semiconductor device according to the third embodiment of the invention.

Next, as shown in FIG. 10C, the P-type body region 22 is formed by implanting P-type impurities such as boron (B) ions to part of the N-well 21. Furthermore, as shown in FIG. 10D, the gate electrode 33 facing the body region 22 via the gate insulating film 32 is formed using poly silicon or the like made conductive by doping with impurities, on part of the surfaces of the gate insulating film 32 and the field oxide film 31.

Figure 10E:
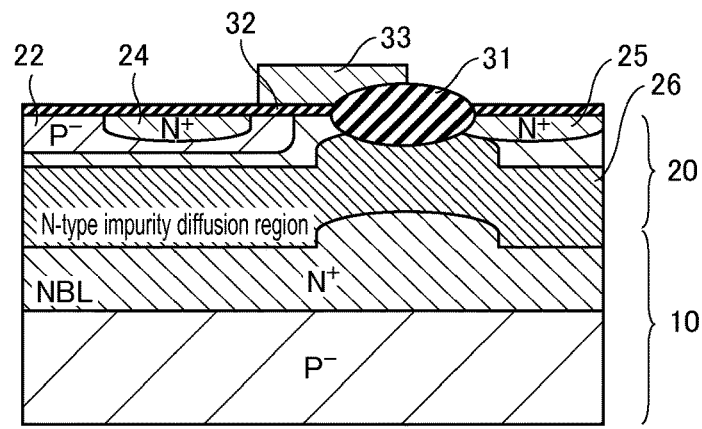
FIG. 10E is a cross-sectional view in a manufacturing process of the semiconductor device according to the third embodiment of the invention.

Next, as shown in FIG. 10E, N-type impurities such as phosphorus (P) ions or arsenic (As) ions are implanted to part of the body region 22 and part of the impurity diffusion region 26. Accordingly, the N-type source region 24 is formed in the body region 22, on one of the sides of the gate electrode 33, and the N-type drain region 25 is formed in the impurity diffusion region 26 such that the field oxide film 31 is held between the drain region 25 and the other side of the gate electrode 33. The following process is similar to the process for manufacturing the semiconductor device according to the first embodiment, and, thus, a description thereof has been omitted.

The foregoing embodiments were described by way of examples using a semiconductor substrate in which the epitaxial layer 20 is formed on the base substrate 10, but the epitaxial layer 20 may be omitted by arranging the buried diffused layer 11 at a predetermined depth in the semiconductor substrate by forming a deep well in the semiconductor substrate. Also, the buried diffused layer 11 may be omitted.

In the case of using an N-type semiconductor substrate, the N-well 21 may be omitted. The invention can be applied not only to semiconductor devices including N-channel LDMOS field effect transistors but also to semiconductor devices including P-channel LDMOS field effect transistors. The invention is not limited to the foregoing embodiments, and various modifications can be made within the technical idea of the invention by a person having ordinary skill in the art.

What is claimed is:

1. A semiconductor device, comprising:
a semiconductor substrate having a main face;
a field oxide film formed in a predetermined region on the main face of the semiconductor substrate;
a body region of a second conductivity type formed in a semiconductor layer of a first conductivity type in the semiconductor substrate;
a gate insulating film formed on part of the main face of the semiconductor substrate;
a gate electrode formed on a surface of the gate insulating film and on a surface of the field oxide film, the gate electrode facing the body region via the gate insulating film;
a source region of the first conductivity type formed in the body region, on a first side of the gate electrode;
a drain region of the first conductivity type formed in the semiconductor substrate such that the field oxide film is disposed between the drain region and a second side of the gate electrode; and
an impurity diffusion region of the first conductivity type having, at least in a partial region thereof between the drain region and the body region, an impurity concentration distribution of the partial region in which a concentration of impurities becomes higher in accordance with a depth from the main face of the semiconductor substrate,
wherein the semiconductor substrate includes a base substrate, an intermediate layer of the first conductivity type formed in a surface portion of the base substrate, and the semiconductor layer of the first conductivity type formed on the intermediate layer, and wherein the impurity diffusion region is in contact with the intermediate layer.

2. The semiconductor device according to claim 1, wherein the impurity diffusion region is in contact with the drain region.

3. The semiconductor device according to claim 2, wherein, in at least part of the impurity diffusion region, a concentration of impurities of the first conductivity type becomes higher in accordance with a distance in a depth direction from the drain region.

4. The semiconductor device according to claim 2, wherein the impurity diffusion region is in contact with the field oxide film.

5. The semiconductor device according to claim 4, wherein, in at least part of the impurity diffusion region, a concentration of impurities of the first conductivity type becomes higher in accordance with a distance in a depth direction from the field oxide film.

6. The semiconductor device according to claim 4, wherein the impurity diffusion region extends out below the body region.

7. The semiconductor device according to claim 6, wherein, in at least part of the impurity diffusion region, a concentration of impurities of the first conductivity type becomes higher in accordance with a distance in a depth direction from the body region.

8. The semiconductor device according to claim 1, wherein the impurity diffusion region is not in contact with the body region.

9. A method for manufacturing a semiconductor device, comprising:

(a) forming a field oxide film, in a predetermined region on a main face of a semiconductor substrate;

(b) forming an impurity diffusion region of a first conductivity type having, at least in a partial region thereof, an impurity concentration distribution of the partial region in which a concentration of impurities becomes higher in accordance with a depth from the main face of the semiconductor substrate, in a semiconductor layer of the first conductivity type in the semiconductor substrate;

(c) forming a body region of a second conductivity type, in the semiconductor layer of the first conductivity type;

(d) forming a gate insulating film, on the main face of the semiconductor substrate;

(e) forming a gate electrode facing the body region via the gate insulating film, on a surface of the gate insulating film and on a surface of the field oxide film; and (f) forming a source region of the first conductivity type in the body region, on a first side of the gate electrode, and forming a drain region of the first conductivity type in the impurity diffusion region such that the field oxide film is disposed between the drain region and a second side of the gate electrode, wherein the semiconductor substrate includes a base substrate, an intermediate layer of the first conductivity type formed in a surface portion of the base substrate, and the semiconductor layer of the first conductivity type formed on the intermediate layer, and wherein the impurity diffusion region is in contact with the intermediate layer.

10. A semiconductor device, comprising:
a semiconductor substrate having a main face;
a field oxide film formed in a predetermined region on the main face of the semiconductor substrate;
a body region of a second conductivity type formed in a semiconductor layer of a first conductivity type in the semiconductor substrate;
a gate insulating film formed on part of the main face of the semiconductor substrate;
a gate electrode formed on a surface of the gate insulating film and on a surface of the field oxide film, the gate electrode facing the body region via the gate insulating film;
a source region of the first conductivity type formed in the body region, on a first side of the gate electrode;
a drain region of the first conductivity type formed in the semiconductor substrate such that the field oxide film is disposed between the drain region and a second side of the gate electrode; and
an impurity diffusion region of the first conductivity type having, at least in a partial region thereof between the drain region and the body region, an impurity concentration distribution of the partial region in which a concentration of impurities becomes higher in accordance with a depth from the main face of the semiconductor substrate to a first depth, and becomes lower in accordance with a depth from the first depth of the semiconductor substrate to a second depth,
wherein the semiconductor substrate includes a base substrate, an intermediate layer of the first conductivity type formed in a surface portion of the base substrate, and the semiconductor layer of the first conductivity type formed on the intermediate layer, and
wherein the impurity diffusion region is in contact with the intermediate layer.

11. A semiconductor device, comprising:
a semiconductor substrate having a main face;
a field oxide film formed in a predetermined region on the main face of the semiconductor substrate;
a body region of a second conductivity type formed in a semiconductor layer of a first conductivity type in the semiconductor substrate;
a gate insulating film formed on part of the main face of the semiconductor substrate;
a gate electrode formed on a surface of the gate insulating film and on a surface of the field oxide film, the gate electrode facing the body region via the gate insulating film;
a source region of the first conductivity type formed in the body region, on a first side of the gate electrode;
a drain region of the first conductivity type formed in the semiconductor substrate such that the field oxide film is disposed between the drain region and a second side of the gate electrode;
an impurity diffusion region of the first conductivity type having, at least in a partial region thereof between the drain region and the body region, an impurity concentration distribution of the partial region in which a concentration of impurities becomes higher in accordance with a depth from the main face of the semiconductor substrate; and
a buried diffused layer formed under the body region and the impurity diffusion region,
wherein a peak impurity concentration of the buried diffused layer is greater than a peak impurity concentration of the impurity diffusion region.

* * * * *